United States Patent [19]

McLellan

[11] Patent Number: 4,921,550
[45] Date of Patent: May 1, 1990

[54] DELAYED REFLOW ALLOY MIX SOLDER PASTE

[75] Inventor: Neil R. McLellan, Dallas, Tex.

[73] Assignee: Texas Instruments Incorporated, Dallas, Tex.

[21] Appl. No.: 384,182

[22] Filed: Jul. 21, 1989

Related U.S. Application Data

[62] Division of Ser. No. 134,394, Dec. 17, 1987, Pat. No. 4,865,654.

[51] Int. Cl.⁵ ............................................. B23K 35/34
[52] U.S. Cl. ....................................... 148/24; 148/25; 148/26
[58] Field of Search .................................. 148/24–26

[56] References Cited

U.S. PATENT DOCUMENTS 4,373,974 2/1983 Barajas .................................. 148/24
4,509,994 4/1985 Barajas .................................. 148/24

*Primary Examiner*—Peter D. Rosenberg
*Attorney, Agent, or Firm*—Gary C. Honeycutt; Melvin Sharp; Rhys Merrett

[57] ABSTRACT

A solder paste mixture for soldering surface mount devices to a circuit board using a reflow soldering process which utilizes a vapor phase furnace. The solder paste mixture has a metallic content which is 63% tin and 37% lead. The metallic content of the paste consists of 150 micron particles of 100% tin and 150 micron particles of an alloy of 10% tin and 90% lead. Included in the process of soldering components to the circuit board is the step of prebaking the circuit board with solder paste and components in their proper place on the board.

5 Claims, 2 Drawing Sheets

DELAYED REFLOW ALLOY MIX SOLDER PASTE

This is a division, of application Ser. No. 07/134,394, filed 12/17/87 U.S. Pat. No. 4865654.

BACKGROUND OF THE INVENTION

1. Field of the Invention

This invention relates to a solder paste for soldering surface mount integrated circuit devices and surface mount discrete devices to circuit boards.

2. Related Art

Surface mount technology is emerging as an important new technique which rapidly is replacing dual-in-line pin (DIP) packaging for VISI devices. Surface mount integrated circuit devices can increase considerably the device density on a circuit board and they are effective in reducing the trace and lead lengths, thereby minimizing electrical noise problems.

Surface mount integrated circuit devices come in a variety of different package styles, including J leaded devices such as plastic leaded chip carriers (PLCCs) and leadless chip carriers (LCCs). These devices often are VLSI with high lead counts.

Traditional board soldering methods, such as wave soldering, applicable to DIPs, are more expensive when used with surface mount devices, hence, new board soldering equipment has been developed for surface mount devices. Typically, for large size boards, a solder paste reflow method is used with a vapor phase furnace. The solder paste usually is a mixture of a tin/lead solder alloy with resin and well-known solvents. The composition of the solder alloy typically is 63% tin and 37% lead, which is the tin/lead alloY composition with the lowest possible melting temperature. That is, 63% tin and 37% lead is the eutectic alloy of tin and lead. This alloy has a melting temperature of 183 degrees C. The solder paste is applied to all points (footpads) on a circuit board to which the leads of surface mount devices are to be soldered. The surface mount devices are then placed upon the circuit board which thereafter is positioned in a vapor phase furnace. In the furnace, the board, the surface mount device leads and the solder paste are rapidly heated to melt the solder to fuse the device leads to the footpads. The furnace temperature is 215 degrees C.

The present day solder paste reflow method is susceptible to producing a high proportion of open solder joints for J leaded integrated circuit devices, and weakened solder joints containing voids and cavities for most surface mount package styles.

An open solder joint between a device lead and a circuit board footpad occurs when most or all of the solder on the footpad wicks up along the length of the lead, leaving an insufficient quantity of solder at the pad to form a solder joint or fillet between the pad and lead. Solder wicking takes place when solder wetting forces on the lead are stronger than those on the footpad, causing the solder to be drawn to the lead surfaces more strongly than to the pad surface. This can happen when solder wetting occurs before or more strongly on the lead surfaces than it does on the footpad surface, and where the lead is sufficiently far from the surface of the pad.

High lead count, VLSI, surface mount devices are susceptible to lead aplanarity. Leads may be out of plane with each other by as much as several mils. Experience has shown that when a lead is farther than about one mil from the surface of a footpad, wicking sufficient to cause an open solder joint can take place. Also, it has been found that approximately five percent of the open solder joints which do occur, happen when lead/footpad separations are between one and two mils, and approximately ninety-five percent of the opens occur when separations are greater than two mils.

In addition to lead/footpad separations of from one to several mils, stronger solder wetting of the lead than the footpad is required for an open solder joint to occur. FIG. 1 shows the temperatures of a typical circuit board and of the leads of a J lead device after insertion into a vapor phase furnace. As seen in FIG. 1, the temperature of the device leads rises from 183 degrees C. (melting point of eutectic solder, and the temperature at which wetting begins) to the furnace temperature of 215 degrees C. more quickly than does the temperature of the circuit board (including the footpads mounted on the board). This occurs because the thermal mass of the circuit board is much greater than that of the leads. Since solder wetting occurs more quickly on hotter surfaces than on cooler ones, it is evident from FIG. 1 that solder wetting will occur more quickly on the lead surfaces than on the footpad surface, thus giving rise to stronger wetting forces attracting the solder to the lead surfaces than to the footpad surface. When the lead/footpad separation is sufficiently great, the wetting forces are dominant and sufficient wicking takes place to form an open solder joint.

Experience with the present day method of reflow soldering J lead devices in a vapor phase furnace has shown that the frequency of occurrence of open solder joints varies from approximately 250 to 2,000 per million solder joints attempted. 1,000 bad joints per million attempted gives a ratio of one bad joint to every 1,000 attempted. Many large modern circuit boards have several thousand joints per board, thus, it is possible to have a zero yield of perfect boards, leading to considerable costs in trouble shooting and rework.

The unwanted creation of voids and cavities in the solder joints between the contacts of surface mount integrated circuit devices and the footpads on the circuit board is another drawback of the present day method of solder reflow in a vapor phase furnace. Most conventional solder pastes outgas solvents and flux vehicles during reflow, or melting of the solder. Unfortunately, some of these gases continue to be produced after the surface layer of solder has melted, and since liquid solder has a very high surface tension which prevents the gases from escaping, the gases are trapped within the joint as voids. Investigation has shown that the voids weaken the solder joint, making it from ten to one thousand times more susceptible to fatigue and cracking, especially where leadless ceramic chip carriers are involved.

SUMMARY OF THE INVENTION

The invention provides a solder paste mixture containing two kinds of particles which, when taken together, give the metallic content of the mixture a net composition of 63% tin and 37% lead, by weight. One of the kinds of particles consists of particles of 10% tin and 90% lead. The other kind of particle is 100% tin. Thus, as a percentage by weight of the total metal content in the mixture, there is approximately 41% of the 10%tin/90%lead kind of particles, and 59% of the 100%tin kind of particles. Also provided by the invention is the process step of prebaking the circuit board with solder paste on its footpads, prior to the soldering step in the vapor phase furnace.

Whereas present day eutectic solder pastes begin melting right away at 183 degrees C., the solder paste of this invention does not begin substantial melting until approximately twelve seconds after it has reached 183 degrees C. The time to melt is proportional to the size of the particles, which enables the time delay before melting to be varied. As seen in FIG. 1, the board takes approximately ten seconds more to reach the eutectic melting point of 183 degrees C. than do the leads, thus, a delay of twelve seconds ensures that the wetting forces on the footpads will be sufficient to prevent wicking of the solder up the leads, thereby preventing or lessening considerably the number of open solder joints produced during reflow soldering in a vapor phase furnace. Testing of the invention has shown that where the leads are no farther than three mils from their footpads, open solder joints are virtually eliminated. In addition, it has been shown that the invention has prevented open solder joints for lead/footpad separations of up to eight mils.

The invention also is effective for increasing the strength of the solder joints and making them less susceptible to fatigue. This is accomplished by driving off most of the volatile substances in the solder paste prior to solder melting at the surface of the joint, thereby producing fewer and smaller voids in the joint. The time delay provided by the solder paste mixture of the invention allows gases to escape from the solder mixture, during the period of the delay, after the eutectic melting point of 183 degrees C. has been reached. Furthermore, the invention provides for a prebake step which takes place prior to insertion of the circuit board into the vapor phase furnace. The prebake step calls for heating the circuit board with the solder paste already on the footpads to allow volatile substances to outgas from the solder paste mixture. Prior to the prebake step, the surface mount integrated circuit devices which are to be soldered to the board, are placed on the board in the positions in which they will be soldered. At this point, the leads or contacts of the devices are in contact with the solder paste on the footpads so that, as the paste hardens during prebake, the hardened paste mechanically holds the devices in the proper positions for the soldering process in the vapor phase furnace.

The amount of void reduction which takes place has been quantitatively evaluated by comparing voids in joints produced using a conventional eutectic solder paste, with voids produced using the solder paste of this invention. After assembly, test devices were lifted off the circuit board, exposing the voids within the solder joints. The diameter of the largest void in each solder joint was then measured using an optical scope with an electronic micrometer. Eighty joints produced using the conventional solder paste were compared with eighty joints produced using the solder paste of this invention, with the result being that the mean maximum void diameter was 1.5 mils for the solder paste of this invention and 4.6 mils for the conventional solder paste. Considered volumetrically, the solder paste of this invention reduced the mean maximum void volume by approximately 97%.

DESCRIPTION OF THE PREFERRED EMBODIMENTS

Figure 2:
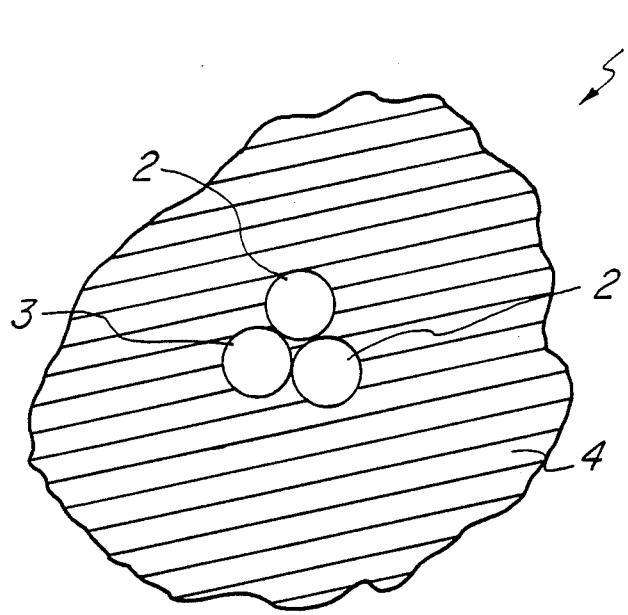
FIG. 2 is magnified view of a section of the solder paste mixture of this invention.

Turning to FIG. 2, the solder paste mixture 1 is shown in which spherical particles of tin 2 and 10%tin/90%lead 3 are mixed together with and suspended in a tacky medium 4. The tin particles 2 are 100% tin while the 10%tin/90%lead particles 3 are an alloy of 10% tin and 90% lead, by weight. The tacky medium 4 is conventional for solder paste and contains solder rosin and well known solvents. The ratio of tin particles 2 to 10%tin/90%lead particles 3 is such, that for the metallic (solder) portion of the mixture 1, the net percentage of tin is 63% while the net percentage of lead is 37%. That is, taken as a whole, the metallic portion of the mixture 1 contains the proper percentages of tin and lead to form an eutectic alloy of tin and lead if all the tin and lead in the mixture were alloyed together. Thus, by weight, approximately 41% of the metallic portion of the mixture is the 10%tin/90%lead alloy and 59% is the pure tin.

Figure 1:
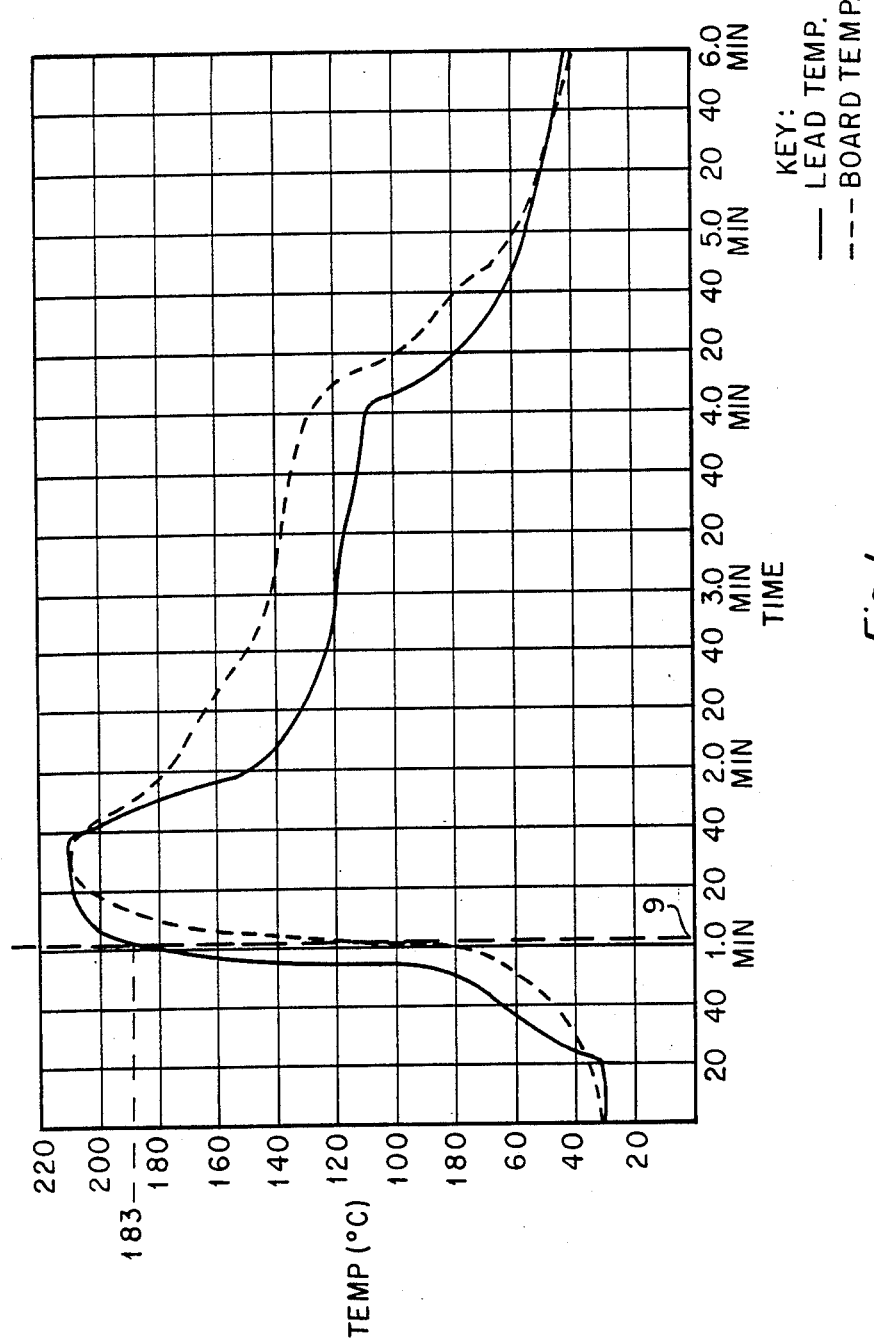
FIG. 1 is a diagram showing the temperature of a typical surface mount circuit board and the temperature of the leads on a J lead integrated circuit surface mount device, both plotted versus the time after insertion of the board and surface mount device into a vapor phase furnace.
Figure 3:
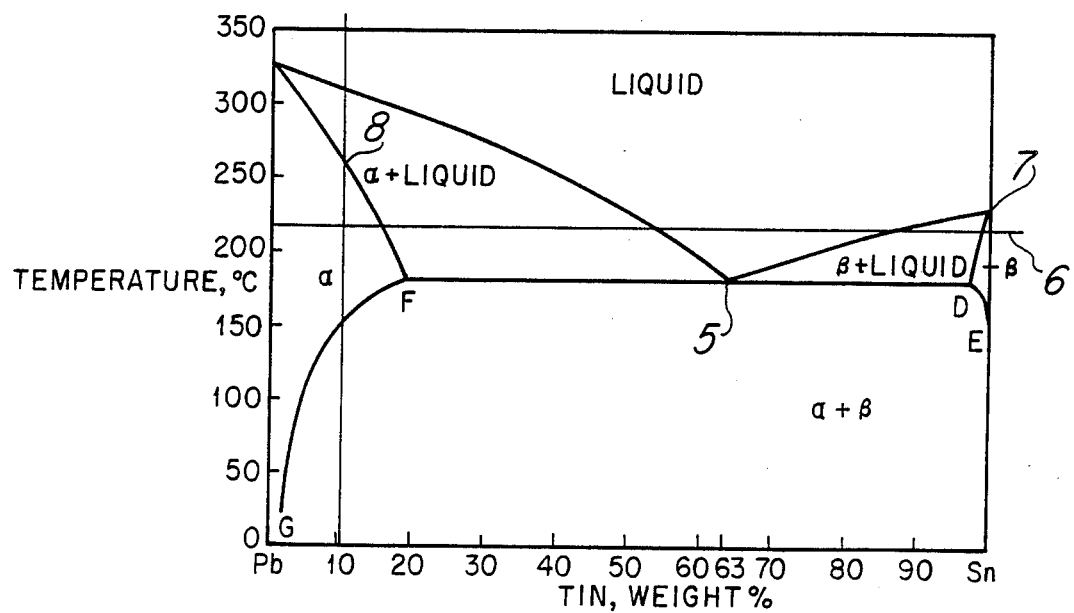
FIG. 3 shows the tin/lead alloy phase diagram.

As seen in FIG. 3, eutectic solder melts at 183 degrees C. at 5, and is seen to be an alloy of 63% tin and 37% lead. This temperature is below the vapor phase furnace temperature of 215 degrees C. indicated at 6. Pure tin melts at 231 degrees C, shown at 7, while a 10%tin/90%lead alloy begins to melt at 263 degrees C., shown at 8, thus, it is seen that both melting points are above the vapor phase furnace temperature of 215 degrees C. indicated at 6. Therefore, if the metallic portion of a solder paste consists of pure tin particles 2 alone or 10%tin/90%lead alloy particles 3 alone, the paste would not melt in a vapor phase furnace. However, the solder paste mixture 1 of this invention will melt at the vapor phase furnace temperature, indicated at 6, even though, taken separately, neither of the two constituent types of particles would melt. This is possible because solid state diffusion at the interfaces between tin particles 2 and 10%tin/90%lead particles 3 will form an alloy at these interfaces which is fusible at the eutectic alloy temperature. In this manner, although all the particles of metal will eventually melt, the melting will be delayed and will not occur as quickly as it would if all the particles were of the eutectic alloy of tin and lead. As seen in FIG. 1, the time delay for melting is measured from the time 9 at which the circuit board reaches the eutectic alloy melting temperature of 183 degrees C.

The amount of time by which melting is delayed is controllable by the rate of solid state diffusion which in turn is controllable by the size of the particles making up the metallic portion of the solder paste mixture 1. The melting rate increases or decreases when the diffusion rate increases or decreases, and the diffusion rate increases or decreases when the particle size increases or decreases. Therefore, the amount of time delay afforded is engineerable through control of the particle size. The preferred size of the particles is 100 microns which affords a time delay of approximately twelve seconds if a prebaking step is used before reflow (solder melting) in a vapor phase furnace.

The solder paste mixture 1 is applied to a circuit board in the same manner as is done with conventional solder pastes. That is, the solder paste mixture 1 is applied to a circuit board by screen printing, which ensures that the solder paste mixture 1 is applied only to the footpads of the board. The thickness of the paste upon the footpads is ten to twelve mils. After the solder paste mixture 1 has been applied to the footpads, surface mount devices, such as integrated circuits and discrete components, are placed upon the board, preferrably by pick-and-place machines, and then the board is prebaked at a temperature of 105 degrees C. for a period lasting from one to four hours.

The prebake step accomplishes at least two things: it lengthens the time delay obtainable for a given size of particle 2 and 3, and it reduces the number and size of voids created in the solder joints.

Prebake eliminates many of the volatile substances in the solder paste mixture 1 which otherwise would gassify during the soldering process in the vapor phase furnace. Gasses released during heating in the vapor phase furnace agitate the metal particles 2, 3 and increase the rate of solid state diffusion, thereby causing the metal particles 2, 3 to melt at a faster rate. Thus, the time delay in melting can be lengthened by decreasing the amount of volatile material in the solder paste mixture 1 prior to heating in the vapor phase furnace.

I claim:

1. A process for delaying solder melt and for minimizing the number and size of voids in a solder joint, comprising the steps of:
   prebaking a circuit board with solder paste on the circuit board footpads, and then
   soldering surface mount devices to the board in a vapor phase furnace.

2. The process of claim 1 in which the solder paste metal content is approximately sixty-three percent tin and thirty-seven percent lead, by weight, and wherein the solder paste metal is in the form of particles of one hundred percent tin and particles of an alloy of approximately ten percent tin and ninety percent lead by weight.

3. The process of claim 3 in which the prebaking is done with the surface mount integrated circuit devices on the circuit board in their proper positions for soldering to the board.

4. The process of claim 2 in which the prebaking takes place at a temperature of approximately one hundred five degrees centigrade.

5. The process of claim 4 in which the prebaking lasts for approximately one to four hours.

* * * * *